Figure 1:
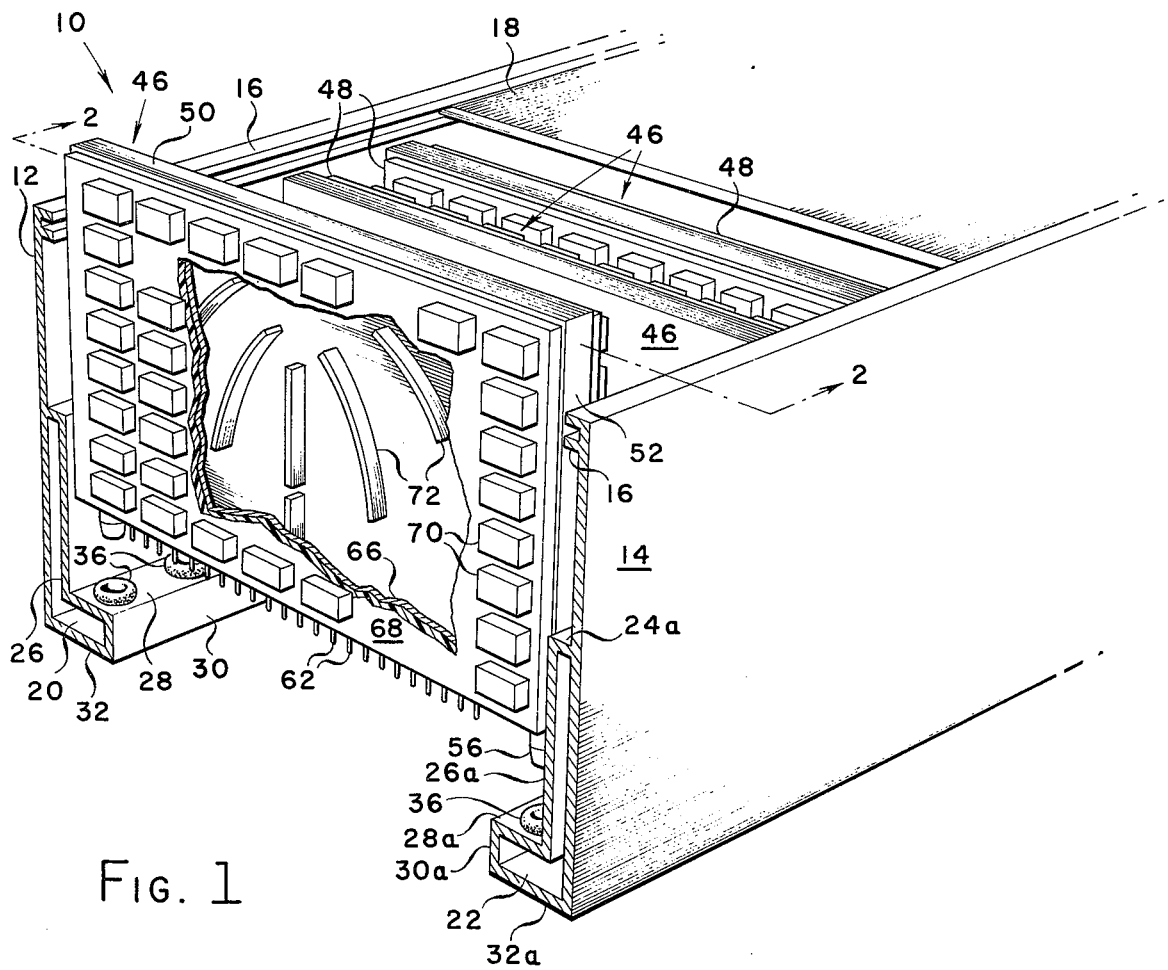

United States Patent [19]
Seid

[11] 3,956,673
[45] May 11, 1976

[54] PRINTED CIRCUIT MODULES COOLED BY RACK WITH FORCED AIR

[75] Inventor: Gordon Seid, Los Angeles, Calif.

[73] Assignee: Lockheed Aircraft Corporation, Burbank, Calif.

[22] Filed: Feb. 14, 1974

[21] Appl. No.: 442,664

[52] U.S. Cl. .................... 317/100; 317/101 DH; 62/418; 165/76; 165/170
[51] Int. Cl.² ..................................... H05K 7/20
[58] Field of Search ......... 317/100, 101 D, 101 DH, 317/101 CB; 174/15 R, 16 R; 165/76, 170; 62/418, 299

[56] References Cited
UNITED STATES PATENTS

| | | | |
|---|---|---|---|
| 3,115,019 | 12/1963 | Rutishauser | 62/418 |
| 3,124,720 | 3/1964 | Green | 317/100 |
| 3,147,402 | 9/1964 | Hochstetter | 317/100 |
| 3,253,646 | 5/1966 | Koltaniak | 174/16 R |
| 3,298,195 | 1/1967 | Raskhodoff | 62/418 |
| 3,329,918 | 7/1967 | Mealy | 174/16 R |
| 3,646,400 | 2/1972 | Demarest | 317/100 |
| 3,648,113 | 3/1972 | Rathjin | 174/15 R |
| 3,771,023 | 11/1973 | Hollingshead | 317/100 |

Primary Examiner—Gerald P. Tolin
Attorney, Agent, or Firm—Billy G. Corber; William Kovensky; Ralph M. Flygare

[57] ABSTRACT

An improved cooling system wherein printed circuit cards are made into modules of two cards each with an enclosed space between them inside the module. The modules cooperate with a rack which carries air passages, and upon connection of the module into the rack, air flows from one side of the rack through the module space, thus cooling the cards from their rear surfaces, thence out of the module, and returned via the other side of the rack.

4 Claims, 4 Drawing Figures

U.S. Patent    May 11, 1976    Sheet 1 of 2    3,956,673

PRINTED CIRCUIT MODULES COOLED BY RACK WITH FORCED AIR

STATEMENT OF GOVERNMENT INTEREST

The invention described herein may be manufactured and used by or for the Government of the U.S. of America for governmental purposes without the payment of any royalties thereon or therefor.

This invention relates to the dissipation of heat generated by printed circuit cards.

The invention was developed in and for the aircraft industry, but it is not so limited, having application wherever large numbers of printed circuit cards are located together, in racks or the like. Large quantities of avionic equipment which in turn comprise enormous numbers of printed circuit cards are required to make modern aircraft operational. As is known, this electronic equipment is utilized for communications, navigation, surveillance, computers, controls, and the myriad of other operations and functions required in a modern aircraft.

Because of the confined space and the relatively large quantity of electronic equipment, appreciable heat is generated, and this heat must be transferred away from the equipment or it will destroy or seriously damage the electronic components. The removal of this heat is an old problem and many prior solutions are known. It is this problem which is solved by the invention, while also producing improvements over all such prior methods.

Some of such prior art cooling means utilize racks for the "black boxes" or arrays of cards, which racks include ducting to deliver cooling air to the electronic devices. The invention utilizes and includes such well known racks in cooperation with its improvements to circulate the cooling air.

Methods of cooling printed circuit cards themselves fall into two general categories; conductive coolers, and air coolers, also called fan coolers, or bath types. Each of these general categories has certain strong points and weak points; and an important advantage of the invention is that it overcomes all the disadvantages while retaining all the advantages of both general types.

In the conductive type cooling methods, the card is gripped at its edges and thereby brought into contact with some cold body or heat sink, such as a passageway in the rack which carries cold air or such as the metal surface of the heat sink. The contact means, usually some kind of clip or clamp, thereby conducts the heat produced by the devices on the board away from those devices through the board itself. Sometimes the board is provided with a heat conductive layer to aid this effect. The advantages of this method are that the devices themselves are not greatly exposed to contamination and corrosion problems as there is no air flow over them. The disadvantages are that large heat temperature gradients are generated within the board, which can be detrimental to the devices furtherest from the heat conducting clips. The heat flow can also have a detrimental effect on the devices closest to the clips and on the board itself.

Another disadvantage is that only a relatively small cross-sectional area; i.e., the cross-section of the card itself, is available for heat flow in these prior systems. This relatively small area restricts the heat flow, thereby increasing the detrimental temperature rise at the components.

The clips or clamps in such prior systems suffer from the disadvantage that they are unreliable, both as to the amount of contact heat transfer area available for heat transfer, since the clips are often wavy or may lose their tension; and as to holding the card in the rack. Some other prior solutions are to bolt or weld the card in place. This permanent type connection does solve the unreliable aspect, but has a corresponding disadvantage of inflexibility to change of the cards. The present invention provides both a highly reliable heat transfer away from the components, while at the same time providing literally "plug in-plug out" changeability of the card modules.

The air or bath types simply flow streams of air through the arrays of cards themselves. For example, a fan at the bottom of a rack could blow air upwardly through many horizontal arrays of vertically disposed printed circuit cards. The advantages of this system are that the cards tend to be uniformly, at least in any one horizontal array, exposed to the cooling air. Another advantage is the relative simplicity of this scheme. The disadvantages are that the arrays closest to the fan are cooled the most; whereas the cards at the top of the rack furtherest from the fan are cooled the least. The major disadvantage of these "bathing" types of cooling systems are that the electronic devices themselves are directly exposed to large quantities of air. This exposure enormously increases the possibilities of damage to the devices by corrosion and contaminants which may be carried in the cooling air. Another disadvantage of this class is the very low cooling efficiency due to the low local air velocity over the components resulting in a high temperature difference between the cooling air and the components; i.e., poor cooling of the components. These bath types also suffer from the disadvantage of poor control of the heat transfer effectiveness among the components; i.e., those blasted by the fan are best cooled.

The prior art has also developed cooling devices known as cold plates, which are the closest to the invention in concept, but which still have the disadvantage of and depend upon substantial amounts of conduction for proper operation. Further, cold plates have not been developed to handle an entire circuit board, but rather cool a single component or a subassembly. Cold plates generally comprise a plenum or other double walled space. The devices to be cooled are fixed to the outside of the cold plate, and the cooling air is flowed through the internal space. Thus there may still be a contact area type problem, depending upon the specific device in question. Various different forms of cold plates are generally available. The advantages are that the devices to be cooled are not exposed to potential contamination or corrosion. However, the disadvantage of the need to conduct the heat through the wall of the cold plate, as in the conduction class of devices, is still present in these cold plates.

The invention provides racks to hold the printed circuit boards, analogous to the racks used in the prior art conduction or bathing types of cooling means. That is, the invention racks are designed to accommodate a large number of cards, and to supply cooling air to the racks. The improvement comprises arranging the printed circuit cards in pairs, and making each pair into a separate plenum or module, with space between the facing inside surfaces of the cards. That is, each two cards define the large side walls of a separate module, and means are provided between the cards to evenly distribute the air throughout the entire inside space between the cards. The racks are made so that one side is a supply of cold air and the other is a return. Each enclosed module of two circuit cards is provided with a pair of air flow pins which plug into the supply and return respectively, whereby the cooling air from the supply flows through the inside of the two card module, thus directly contacting the backs of both cards and directly cooling the components connected to the cards.

The difference between the invention structure and the prior cold plates should be evident; i.e., the intervening wall of the cold plate is eliminated, and the air contacts the printed circuit card directly. In this manner, the components are not exposed to a flow of contaminating air, but yet there is no substantial conduction problem as the backs of the cards as well as perhaps the backs of the components themselves, are directly cooled.

The relatively long heat transfer path from the heat generating component to the cooling air in the prior art is diminished to only no more than the thickness of the card in the invention. The entire back side of each card is used to transfer heat to the cooling air, as compared to only the cross-sectional area of the card which is used to conduct heat in the prior conductive methods. The invention also eliminates the unreliable amount of contact heat transfer surface area in such methods. At the same time, the highly advantageous "plug-in" capability is retained. The cooling effectiveness of the electronic component in the invention can be easily controlled by adjustment of the gap space between the cards in the module; i.e., the narrower the gap the higher the velocity and the higher the cooling effectiveness.

The supply and return channels in the rack for cooperation with the invention card modules are provided with means to seal off the openings that receive the air flow pins when a module is not in place therein.

The invention thus retains one of the important advantages of printed circuit arrays in racks in that a faulty card is removed just as it would be in a bath type of cooling system. Of course, two cards must be removed since they are in pairs, but this is deemed a minor problem as only the faulty component will be replaced, and the spare part storage problem, modules of pairs of cards instead of single cards, is only insignificantly increased.

Another feature is that each assembly of the invention printed circuit card modules can be provided with a lid, or even completely enclosed, thereby further enhancing the advantage of no chance contamination, such as dust or liquids, falling upon the electronic components on the cards.

Figure 3:
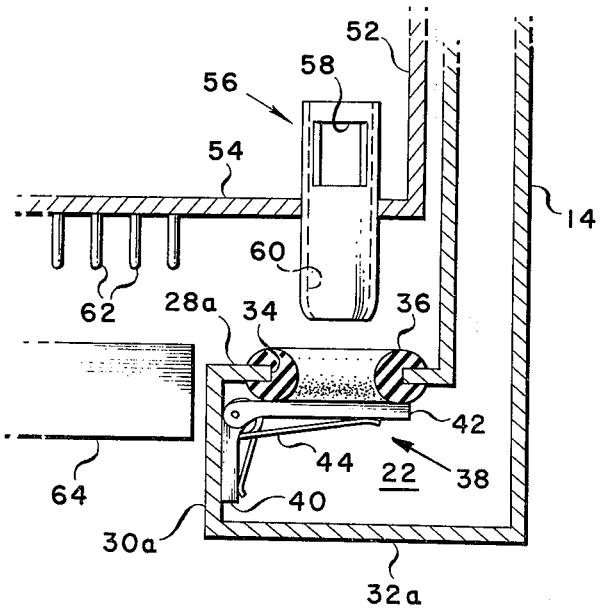
Figure 4:
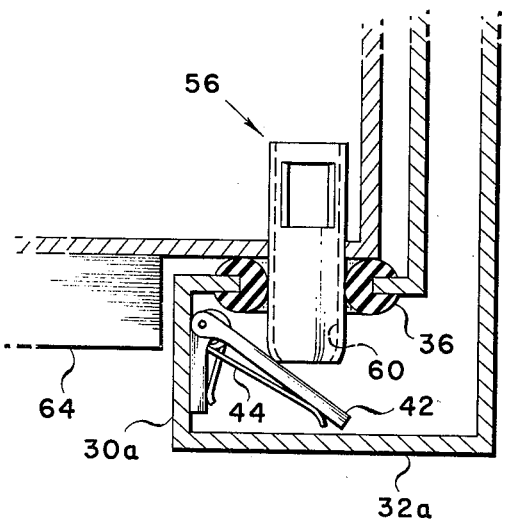
Figure 2:
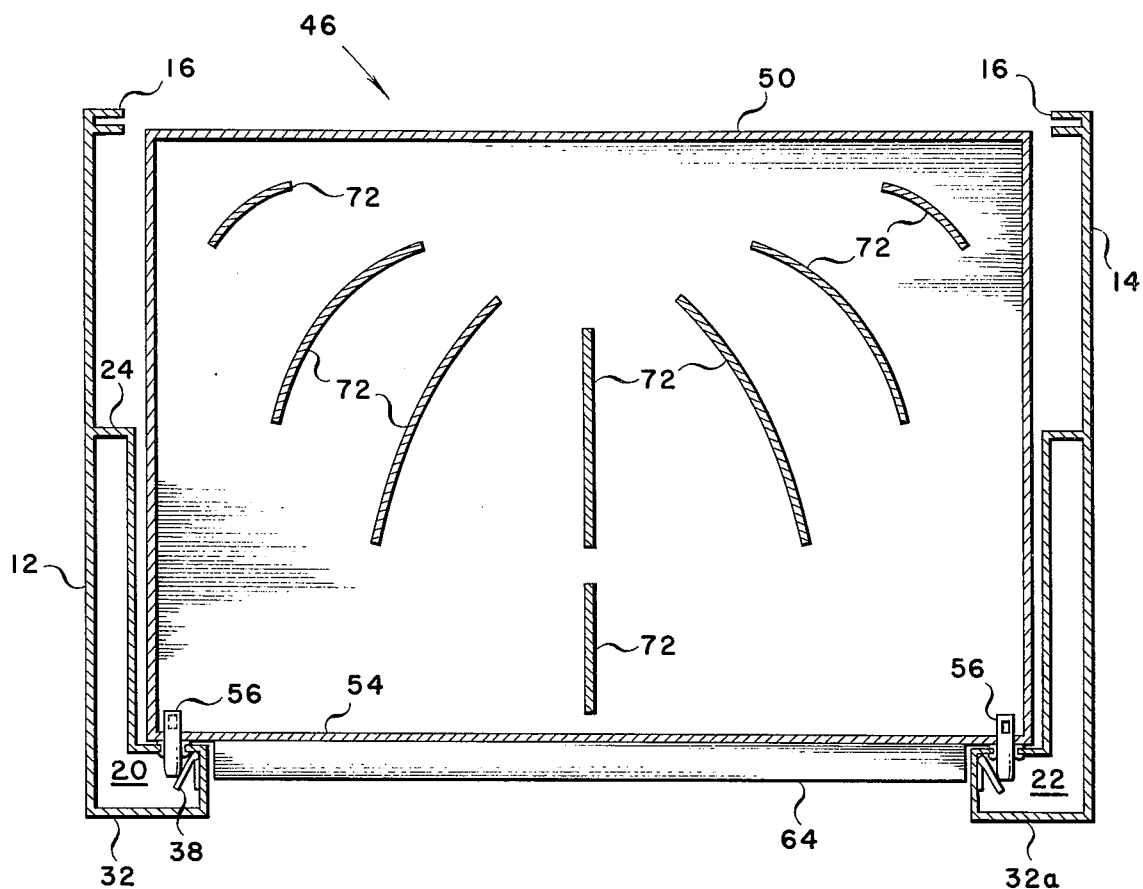

The above and other advantages of the invention will be pointed out or will become evident in the following detailed description and claims, and in the accompanying drawing also forming a part of this disclosure; in which FIG. 1 is a perspective view of an avionics array of printed circuit card modules embodying the invention, with some parts broken away and in cross-section and with the lid retracted;

FIG. 2 is a cross-sectional view taken generally on line 2—2 of FIG. 1 but with the module fully in place in the rack; and FIGS. 3 and 4 are enlarged detailed views showing an air pin before and after insertion in the rack, and also showing the automatic air flow shutoff means.

Referring now in detail to FIG. 1, the embodiment 10 shown comprises a pair of side walls 12 and 14, each of which is formed with a double inwardly extending lip portion 16 which slidingly receives a lid 18. Of course, other conventional manners of closing the top of rack 10 can be used.

At their lower ends, walls 12 and 14 each comprise an air flow passage 20 and 22 which may be structurally identical. Passage 20 is defined by a top wall 24, an upper vertical wall 26, a ledge wall 28, a lower vertical wall 30, and a bottom wall 32 which connects back to the bottom end of side wall 12. Thus, the walls 24 through 32 together with wall 12 define an "L" shaped air passage. The passageway 22 is identical; it is made up of the same walls 24 through 32 indicated on the drawing by the same reference numerals followed by "a". Ledge wall 28 is formed with a row of openings 34 each of which is fitted with a washer or grommet 36 of rubber or other elastomeric material. The same structure exists on ledge wall 28a on the other side.

Means are provided to seal the openings containing the grommets 36 when the invention modules are not in place. To this end, a hinge-like device 38 has one leg 40 fixed by any suitable means to the inside of the lower vertical wall 30, and has its other leg 42 normally urged by a spring 44 up against the underside of the grommet 36. The operation of this air close off means should now be manifest from an examination of FIGS. 3 and 4.

The rack part only of the invention thus far described is very similar to the present state-of-the-art, with a possible exception of the openings 34 with their grommets 36, which, as is obvious to those skilled in the art, is a simple modification. The passages 20 and 22 are also amenable to being built into existing air handling systems in avionic racks with simple modifications at their ends. Because of the symmetry of the halves of the rack the air flow is reversible; i.e., either passageway 20 or 22 could be either the return or the supply. This is an advantage in that an occasional flow reversal could serve to flush dust particles or other contaminants which might fortuitously enter the system.

The second part of the invention, in addition to the rack, is a plurality of printed circuit card modules 46. Each module 46 comprises one or two printed circuit cards 48 which define the side walls of the module 46. The two cards 48, or one card 48 and a dummy wall in lieu of one of the cards 48 if desired, are joined together by a top wall 50, a pair of side walls 52 and a bottom wall 54. Thus, an enclosed internal space is defined by these six sides between the two cards 48. Bottom wall 54 carries a pair of hollow tubes or air pins 56 which pass through suitable openings in the bottom wall and are fixed therein. Each pin 56 comprises an opening 58 located in the space between the cards, which opening communicates with the central opening 60 through the pin 56. Depending upon the natures of the particular cards 48, their electrical contact pins 62 may or may not be mounted in the wall 54. These pins cooperate with a suitable connector 64; see FIGS. 2, 3 and 4.

The invention was designed for use in aircraft, and accordingly, the cards 48 are of a type common in aircraft. They comprise a base or substrate layer 66 which is commonly aluminum or other metal. On top of this layer 66 is an insulation layer 68 which is commonly of plastic or fiberglass material and is bonded to the base layer 66. The electronic components 70 are fixed to this layer 68, as is the printed circuitry, not shown. The invention is equally amenable for use with other types of printed circuit cards, such as the types commonly used in radio and television wherein the components are on one side of a single insulating layer and the printed circuitry is on the opposite side. However, such communications types of printed circuit cards may not have sufficient heat generation problems to warrant use of the invention.

The term "PC card" as used in the specification and claims herein shall be understood to mean any such assemblage of at least an insulating layer carrying a plurality of electrical components and circuitry interconnecting said components. All the various variations and modifications are included in this definition, such as the aircraft type shown in the drawing, and types wherein the components and the circuitry are wholly or partly on the same or on opposite sides, and the like.

Means are provided to distribute the flow of air from one of the pins 56 evenly through all of the space between the PC cards, and then out via the other pin 56. To this end, referring to FIG. 2, a plurality of vanes 72 are provided which force the air into a pattern to cover the entire space between the cards. These vanes 72 may be formed of any convenient material, such as aluminum epoxied or spot-welded to the inside of the base layer 66.

While the invention has been described in detail above, it is to be understood that this detailed description is by way of example only, and the protection granted is to be limited only within the spirit of the invention and the scope of the following claims.

I claim:

1. An air-cooled circuit card module comprising at least one planar circuit card having a first surface for carrying circuit components thereon and a second surface on the opposite side of said card and lying in a plane parallel with respect to the plane of said first surface; said module defining an enclosed space and having one interior wall thereof substantially defined by said second surface of said circuit card; a rack having first and second sides; means mounting said module in said rack and extending from side-to-side across said rack; air passage means formed in each side of said rack; and a hollow air pin having a first end connected to said module and extending through a wall thereof and having a second end extending into said air passage means in said rack for supplying air from one side of said rack into said enclosed space; and means for returning said air from the other side of said enclosed space to the other side of said rack whereby heat is transferred away from said second surface of said circuit card.

2. The combination of claim 1 including a resilient grommet interposed between said air pin and said air passage means, whereby a seal is formed around said pin.

3. The combination of claim 1 including valve means mounted on said rack for closing the connection between said air supplying means and said module in the event said module is separated from said rack.

4. The combination of claim 3 wherein said valve means comprises a resilient grommet interposed between said air pin and said air passage means, whereby a seal is formed around said pin upon insertion of said pin through said grommet; and, a spring-loaded hinge means mounted within said air passage means and normally abutting the underside of said grommet whenever said module is separated from said rack and being adapted to be pushed away from said grommet upon insertion of said air pin therethrough.

* * * * *